(12) United States Patent
Nance et al.

(10) Patent No.: US 6,171,935 B1
(45) Date of Patent: Jan. 9, 2001

(54) PROCESS FOR PRODUCING AN EPITAXIAL LAYER WITH LATERALLY VARYING DOPING

(75) Inventors: Paul Nance; Wolfgang Werner, both of Munich (DE)

(73) Assignee: Siemens Aktiengesellschaft, Munich (DE)

(*) Notice: Under 35 U.S.C. 154(b), the term of this patent shall be extended for 0 days.

(21) Appl. No.: 09/317,694

(22) Filed: May 24, 1999

(30) Foreign Application Priority Data

May 6, 1998 (DE) .............................. 198 20 223

(51) Int. Cl.[7] .................................................. H01L 21/20
(52) U.S. Cl. .......................... 438/489; 438/494; 438/969
(58) Field of Search .................................. 438/489, 494, 438/493, 969, FOR 249, FOR 259, FOR 270

(56) References Cited

U.S. PATENT DOCUMENTS

| | | | |
|---|---|---|---|
| 3,791,882 | * | 2/1974 | Ogiue . |
| 3,947,299 | * | 3/1976 | Hendrik et al. . |
| 4,036,672 | * | 7/1977 | Kobayashi . |
| 4,619,033 | * | 10/1986 | Jastrzebski . |
| 4,754,310 | | 6/1988 | Coe . |
| 4,994,871 | | 2/1991 | Chang . |
| 5,216,275 | | 6/1993 | Chen ..................................... 257/493 |
| 5,438,215 | | 8/1995 | Tihanyi .................................. 257/78 |

FOREIGN PATENT DOCUMENTS

3242736 A1   5/1983 (DE) .

OTHER PUBLICATIONS

European Patent Application—Publication No. 0 267082, Date of Filing: Oct. 8, 1987, Application No. 87402250.2.
"Modern Power Devices", by B. Jayant Baliga, 1987, John Wiley & Sons, pp. 338–343.

* cited by examiner

Primary Examiner—George Fourson
Assistant Examiner—Michelle Estrada
(74) Attorney, Agent, or Firm—Irwin Ostroff; Arthur J. Torsiglieri

(57) ABSTRACT

A process for producing an epitaxial layer with laterally varying doping includes the following steps: (a) applying a patterned insulator layer to a semiconductor body; (b) growing a first epitaxial layer on the semiconductor body and the patterned insulator layer so that monocrystalline regions are formed over the semiconductor body and polycrystalline regions are formed over the patterned insulator layer, the angle of inclination ($\alpha$) of the interface between the monocrystalline regions and the polycrystalline regions depending on the grain size of the polycrystalline regions; (c) removing the polycrystalline regions and the insulator layer, and (d) growing a second epitaxial layer which, together with the monocrystalline regions of the first epitaxial layer, forms the epitaxial layer.

13 Claims, 3 Drawing Sheets

PROCESS FOR PRODUCING AN EPITAXIAL LAYER WITH LATERALLY VARYING DOPING

FIELD OF THE INVENTION

The present invention relates to a process for producing an epitaxial layer with laterally varying doping. The laterally varying doping may, for example, involve a laterally varying doping concentration or, alternatively, a laterally varying doping type, so that n-type doped regions and p-type doped regions alternate with one another in the epitaxial layer.

BACKGROUND OF THE INVENTION

When wishing to obtain layers with varying doping, so-called trench technology has hitherto been employed. However, this technology suffers from unavoidable disadvantages since trenches can economically be formed only to a depth of a few $\mu$m, because it relies on relatively low etching rates for etching the trenches. Etched trenches have very steep side walls and tend to assume a curved shape when a high lateral etching rate is used. This may possibly lead to gaps in the epitaxial layer. Overall, with the conventional process, the production costs are relatively high and the yield leaves much to be desired.

Epitaxial layers with laterally varying doping are, for example, needed for the production of high-voltage MOSFETS, as are described in DE 43 09 764 C2. In this known high-voltage MOSFET, in an inner zone within a space-charge zone that extends in the event of a high threshold voltage, additional zones of conductivity type opposite to that of the inner zone are arranged so that regions with respectively opposite conductivity types alternate with one another in the lateral direction. By virtue of these additional zones, it is possible to provide the MOSFET with a low bulk resistance in the conducting region, even though it has a high threshold voltage.

Satisfactory production of an epitaxial layer with laterally varying doping, that is to say an epitaxial layer in which, for example, p-type conductivity regions and n-type conductivity regions alternate with one another laterally, has not yet satisfactorily been achieved.

It is desirable to have a process for producing an epitaxial layer with lateral varying doping. It is also useful that the angle of inclination of the interfaces between the differently doped regions of the epitaxial layer be controlled.

SUMMARY OF THE INVENTION

The present invention is directed to a process for forming on a top surface of a semiconductive body an epitaxial semiconductive layer whose conductivity characteristics vary laterally across the surface. The process comprises the steps of: (a) applying a patterned insulator layer to a semiconductor body of one conductivity type; (b) growing a first epitaxial layer of the one conductivity type or of the conductivity type, on the semiconductor body and the patterned insulator layer so that monocrystalline regions are created over the semiconductor body and polycrystalline regions are created over the patterned insulator layer, the angle of inclination of the interface, between the monocrystalline regions and the polycrystalline regions, extending essentially perpendicular to the surface of the semiconductor body and depending on the grain size of the polycrystalline silicon of the polycrystalline regions; (c) removing the polycrystalline regions and the patterned insulator layer, and (d) growing a second epitaxial layer with a conductivity type that is either opposite to the conductivity type of the first epitaxial layer, or with the same conduction type but with a different doping concentration, on the semiconductor body in the eroded polycrystalline regions in order, together with the monocrystalline regions of the first epitaxial layer, to form the epitaxial layer.

The process according to the invention thus firstly uses the fact that a polycrystalline silicon layer is formed on an insulator layer, for example, a silicon dioxide layer, if the epitaxy is carried out in an appropriate manner. At the same time, however, a monocrystalline layer is created over the regions of the semiconductor body that are free of the insulator layer, since the epitaxial layer can grow here on the monocrystalline material of the semiconductor body.

The polycrystalline silicon layer grows depending on the original crystal orientation, either wider or narrower, as its thickness increases. By virtue of this, it is thus possible to adjust the angle of inclination of the interfaces between the different regions of the first epitaxial layer by means of the grain size of the polycrystalline material. This grain size is customarily controlled by the deposition technique.

If desired, it is possible to also use the insulator layer as a mask, for example, in ion implantation, to introduce an impurity into the semiconductor body at targeted locations to change the conduction properties of the implanted regions.

Following the epitaxial deposition of the first epitaxial layer, the polycrystalline silicon regions are removed, for example by selective etching. As an alternative, the removal of the polycrystalline may also be carried out by etching along an expected boundary between the moncrystalline and polycrystalline edge down to the insulator layer, the insulator layer then acting as an etch stop. For etching the polycrystalline regions, use may be made of the fact that the doping of polycrystalline silicon takes place substantially more rapidly than the doping monocrystalline silicon.

After the polycrystalline regions and underlying patterned insulator layer have been removed, a second epitaxial layer is deposited. It likewise grows in monocrystalline fashion on the underlying semiconductor body. This second epitaxial layer may have the same conductivity type as the first epitaxial layer or, alternatively, the conductivity type opposite to this. Furthermore, one of the two epitaxial layers is preferably doped in the opposite type to the underlying semiconductor body. It is, however, also possible to provide both epitaxial layers with the same conductivity type, so that the first epitaxial layer differs from the second epitaxial layer merely by a different doping concentration instead of a different conductivity type. It will be convenient to describe a difference in either the conductivity type or a doping concentration generally as a difference in conduction characteristics.

In order to produce the high-voltage MOSFET described in DE 43 09 764 C2, a p-type conductivity epitaxial layer is firstly applied, for example, to an n-type conductivity doped wafer. This is followed by the production of a patterned insulator layer of, for example, silicon dioxide on this p-type conductivity epitaxial layer.

Next, the first epitaxial layer is deposited. This layer grows in monocrystalline fashion on the semiconductor body itself and in the polycrystallone fashion on the insulator. The polycrystalline regions formed in this wasy, and the underlying parts of the insulator layer, are removed. This is followed by further epitaxy, in which a second n-type conductivity epitaxial layer is applied in the regions on the semiconductor body that had previously been cleared of the polysilicon layer and the insulator layer. This second epitaxial layer therefore grows in monocrystalline fashion in the said regions, so that overall an epitaxial layer is obtained in which the p-type conductivity regions and n-type conductivity regions alternate with one another in the lateral direction. The second epitaxial layer may in this case be grown with a layer thickness such that it covers the monocrystalline regions of the first epitaxial layer. This means that, if the conductivity type of the first and second epitaxial layers are different, then for example all n-type conductivity regions, which are formed by the first epitaxial layer, are doped from the rear of the wafer, while all p-type conductivity regions of the second epitaxial layer, are connected to one another on the front of the wafer. In this case, the underlying pattern is still visible and can be used for alignment purposes. Contact may be made with the first and second epitaxial layers in the usual way, as for example, as with a DMOS transistor.

Viewed from on aspect, the present invention is directed to a process for forming over a top surface of a moncrystalline semiconductive body an epitaxial semiconductive layer whose conductivity characteristics vary laterally across the surface. The process comprises the steps of: forming over the top surface of the moncrystalline semiconductive body a patterned insulating layer; growing over the top surface a first semiconductive layer that forms moncrystalline regions where it overlies the monocrystalline semiconductive body and polycrystalline regions where it overlies the patterned insulating layer; removing selectively the polycrystalline regions and the insulating layer; and growing over the top surface a second semiconductive layer with conductivity characteristics different from that of the first semiconductive layer for forming essentially monocrystalline regions of said different conductivity characteristic between the monocrystalline regions of said first semiconductive layer.

Viewed from another aspect, the present invention is directed to a process for producing an epitaxial layer with laterally varying doping. The process comprises the steps of: applying a patterned insulator layer to a semiconductor body; growing a first epitaxial layer on the semiconductor body and the patterned insulator layer so that monocrystalline regions are formed over the semiconductor body and polycrystalline regions are formed over the patterned insulator layer, the angle of inclination (α) of the interface between the monocrystalline regions and the polycrystalline regions depending on the grain size of the polycrystalline regions; removing the polycrystalline regions (6) and the insulator layer; and growing a second epitaxial layer which, together with the monocrystalline regions of the first epitaxial layer, forms the epitaxial layer.

The invention will be better understood in view of the drawings, detailed description, and claims.

DETAILED DESCRIPTION OF THE INVENTION

Figure 1:
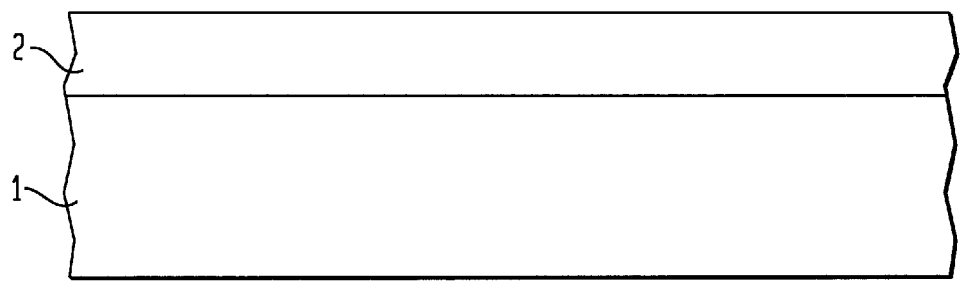
FIGS. 1 to 6 respectively show sectional representations intended to explain the process according to the invention.
Figure 2:
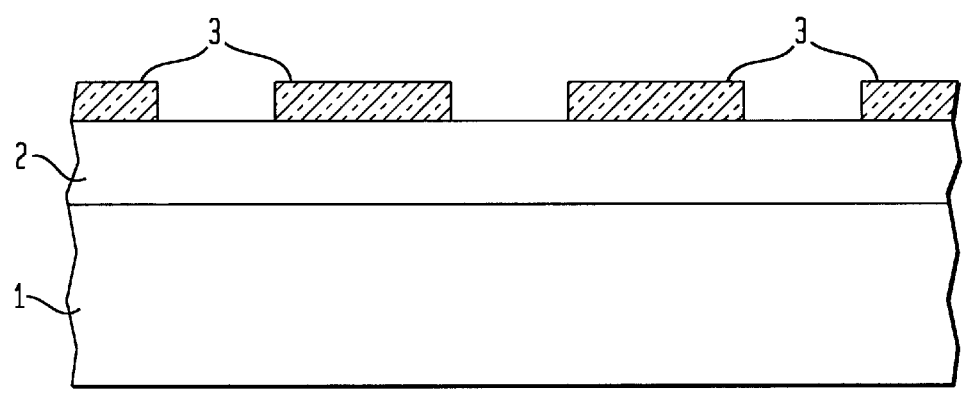

FIG. 1 shows an n+ type conducting silicon substrate 1 that, for example, is doped with arsenic, and has a layer thickness of about 525 μm and a resistivity of, for example, 5 micro-ohm-cm. On this substrate 1, an n-type conductivity epitaxial layer 2 is optiomally be provided which, for example, may be doped with phosphorous.

On the semiconductor body formed in this, with a substrate 1 and the epitaxial layer 2, a patterned insulator layer 3 of silicon dioxide is applied in the usual way, which can be done using the customary photoresist and etching techniques. It is then possible, using the mask formed by the patterned insulator layer 3, to carry out doping in the semiconductor body made up of the epitaxial layer 2 and the substrate 1, for which, for example, ion implantation is suitable. This step is not, however, represented in the figures since it is not necessary for the process according to the invention.

Figure 3:
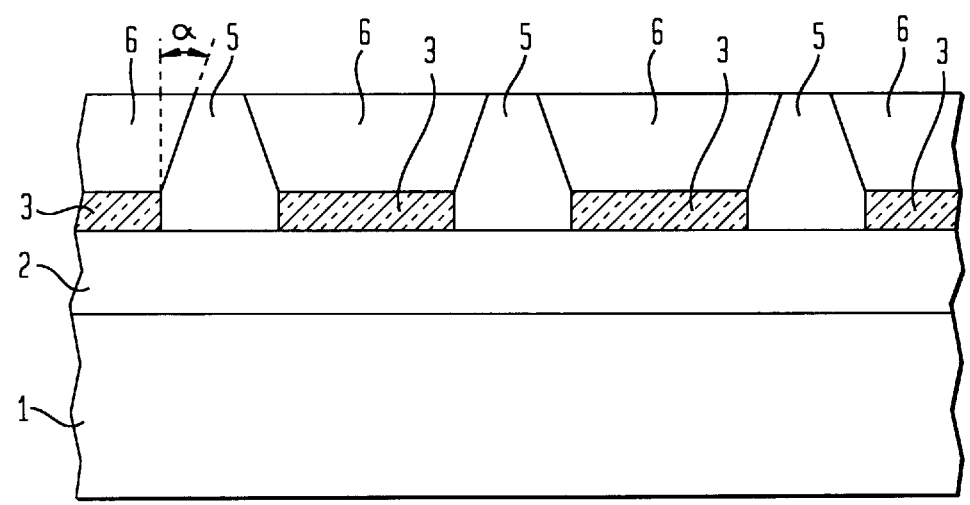

Next, as shown in FIG. 3, a first epitaxial layer is applied to the patterned insulator layer 3 and the semiconductor body. This results in the formation of lightly dope p-type doped monocrystalline regions 5 being formed on the monocrystalline semiconductor body 1 and polycrystalline regions 6 being formed on the insulator layer 3. The angle inclination of the interface between the regions 5 and 6 depends in this case on the grain size of the polycrystalline silicon of the regions 6. In other words, the angle α of this interface can be controlled by corresponding adjustment of the grain size of the polycrystalline silicon. This adjustment may be carried out in the conventional way.

Figure 4:
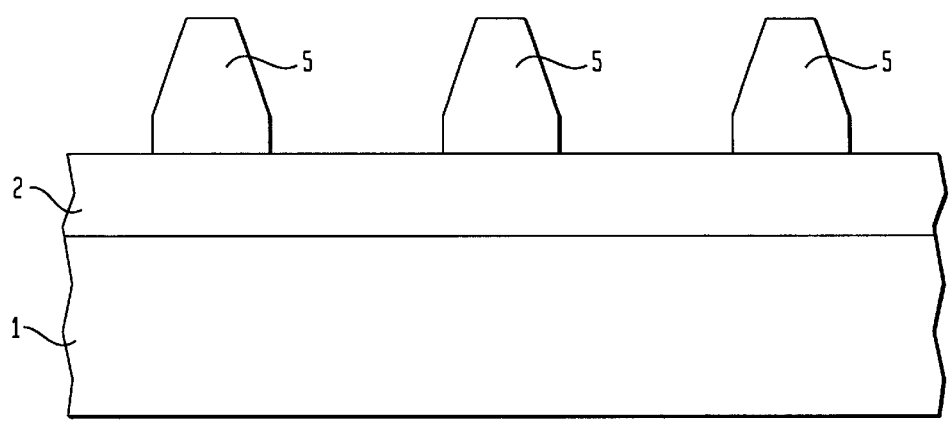

Next, as shown in FIG. 4, the polycrystalline regions 6 and the underlying oxide layer 3 are removed by selective etching. As an alternative, the polycrystalline silicon of the regions 6 may also be removed by etching along the expected compression edge down to the insulator layer 3. This may, for example, be done in each case starting from the middle of the individual regions 6, since the pressure is a maximum here.

The removal of the polycrystalline silicon from the regions 6 is also facilitated by the fact that the underlying insulator layer 3 of silicon dioxide acts as an etching stop. The insulator layer 3 is then lastly removed by stripping.

For removal of the polycrystalline silicon of the regions 6, use may also be made of the fact that etching of polycrystalline silicon takes place substantially more rapidly than etching of monocrystalline silicon. In other words, the difference in etching rate for these two types of silicon can be controlled by doping the polycrystalline silicon.

Figure 5:
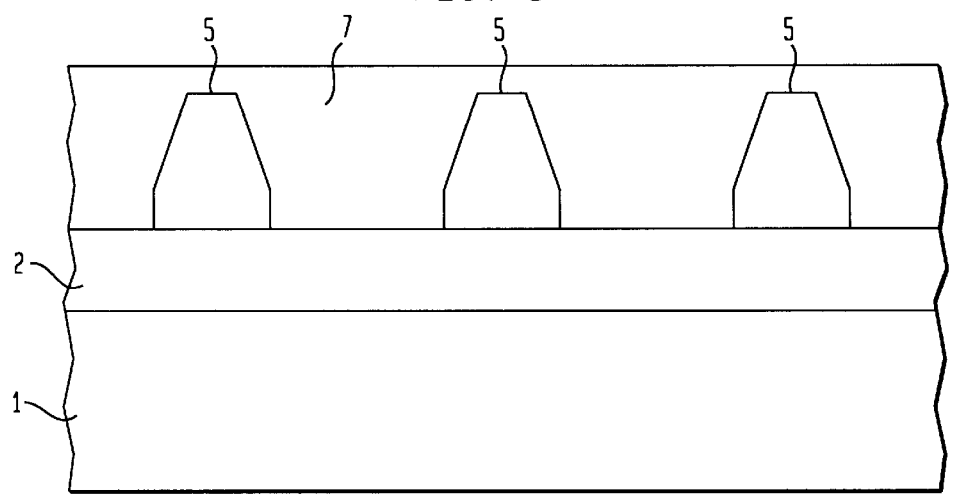

As shown in FIG. 5, a second epitaxial layer 7 is then applied surface-wide on the structure in FIG. 4 so that this layer 7 grows in monocrystalline fashion on the monocrystalline epitaxial layer 2 and, finally, grows over the monocrystalline regions 5. This layer 7 is, for example, lightly doped n-type doped with phosphorous. After the layer 7 has been planarized, the strucure shown in FIG. 5 is thus obtained.

Figure 6:
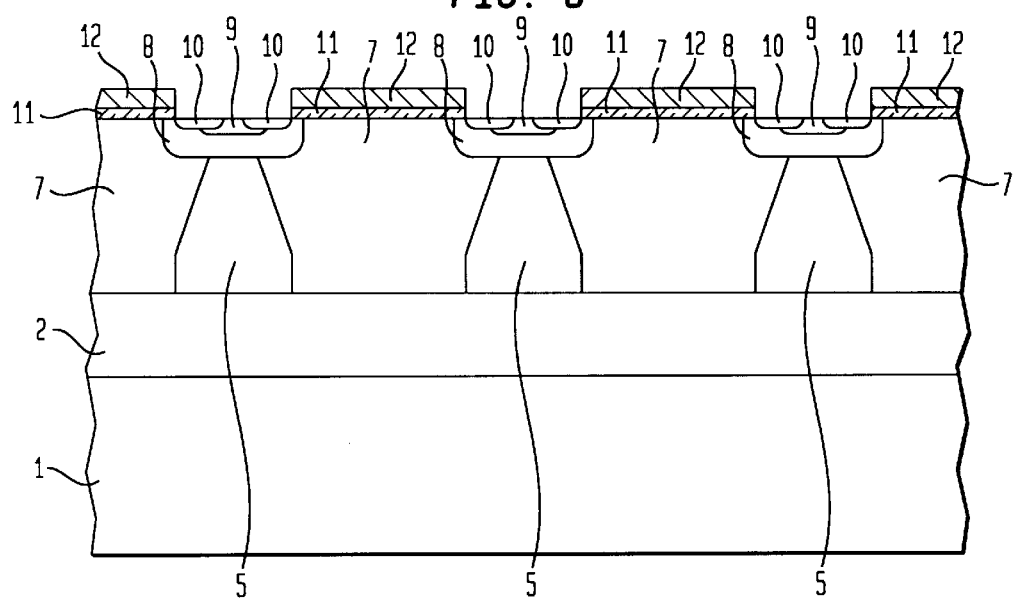

Lastly, as shown in FIG. 6, a p-type doped well region 8, a p+ type doped contact region 9 and an n+ type doped source region 10 are formed in the surface region of the second epitaxial layer 7 above the p-type conductivity regions 5. Furthermore, a gate insulator layer 11 and gate electrodes 12 are shown. With the process according to the invention, it is therefore possible to form lightly doped p-type conducting regions 5 and lightly doped n-type conductivity regions 7 laterally next to one another in an epitaxial layer, the layer thickness of this epitaxial layer being subject to virtually no restrictions. It is therefore possible to produce differently doped regions or, alternatively, regions with different doping concentrations laterally next to one another in an epitaxy layer. Such differently doped regions are needed in order, for example, to produce a high-voltage MOSFET, as described in DE 43 09 764 C2 mentioned above.

In the above illustrative embodiment, of course, there are many possible variants; for example, the layer 2 may also be p-doped and the layers 5 and 7 may have the same conductivity type, and differ from one another merely in their doping concentration.

Disadvantages, such as gaps, as occur in the prior art, can reliably be avoided with the process according to the invention. It is also possible to readily adjust the angle Á of the interface between the regions 5 and 7 in a desired way, so that, for example, the regions 5 taper conically to their top—which is favourable for forming the regions 7 using the second epitaxial layer without gaps.

Figure 7:
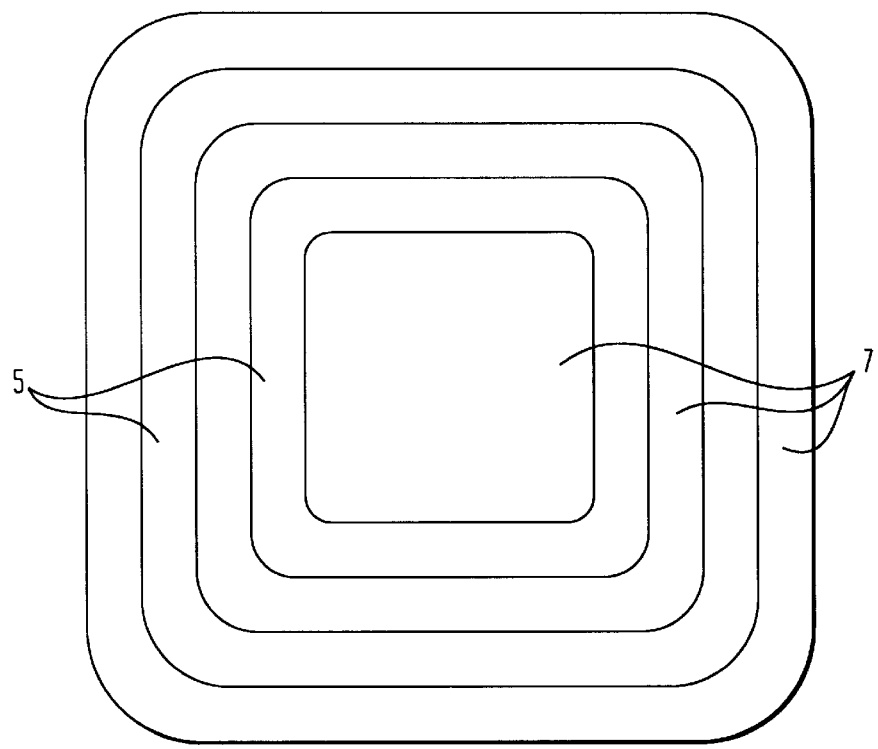
FIGS. 7 and 8 show plan views of possible arrangements of p-type conductivity structures and n-type conductivity structures which are produced using the process according to the invention.
Figure 8:
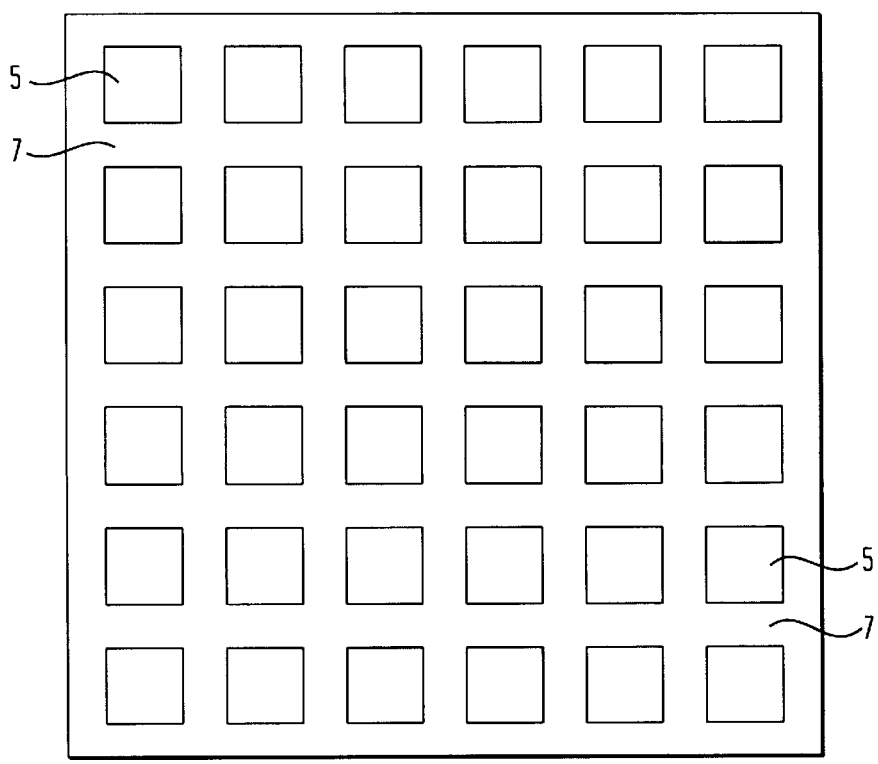

FIGS. 7 and 8 are plan views of structures produced using the process according to the invention and with possible configurations of the regions 5 and 7, respectively. In FIG. 7, regions 5, 7 are provided in ring form, while FIG. 8 shows an illustrative embodiment in which the regions 5 are configured as columns with square cross section within the region 7.

What is claimed is:

1. A process for forming over a top surface of a monocrystalline semiconductive body an epitaxial semiconductive layer whose conductivity characteristics vary laterally across the surface comprising the steps of:

forming over the top surface of the monocrystalline semiconductive body a patterned insulating layer;

growing over the top surface a first semiconductive layer that forms monocrystalline regions where it overlies the monocrystalline semiconductive body and polycrystalline regions where it overlies the patterned insulating layer;

removing selectively the polycrystalline regions and the insulating layer; and growing over the top surface a second semiconductive layer with conductivity characteristics different from that of the first semiconductive layer for forming essentially monocrystalline regions of said different conductivity characteristic between the monocrystalline regions of said first semiconductive layer.

2. The process of claim 1 in which the different conductivity characteristic is a difference in conductivity type.

3. The process of claim 1 in which the different conductivity characteristic is a difference in doping concentration.

4. The process of claim 1 in which the monocrystalline semiconductive body initially includes an epitaxial layer over its top surface.

5. The process of claim 1 in which after the formation of the patterned insulating layer it is used as a mask for doping the semiconductive body before the growth of the first semiconductive layer.

6. The process of claim 1 in which the growing of the first semiconductive layer is done under conditions to promote the growth of polycrystalline regions that form interfaces with the monocrystalline regions that are essentially perpendicular to the surface of the semiconductive body.

7. The process of claim 6 in which factors that control the growth of the polycrystalline region are the size of the grains of the polycrystalline regions.

8. The process of claim 1 in which the insulating layer is silicon dioxide that acts as an etch stop in the removal of the polycrystalline regions.

9. The process of claim 1 in which the first layer is grown to form conical monocrystalline regions between the polycrystalline regions.

10. The process of claim 1 in which the second layer is grown to overlap and merge over tops of the monocrystalline regions of the first semiconductive layer and the top surface is planarized to the level of the monocrystalline regions of the first layer.

11. The process of claim 1 in which the patterned insulating layer includes a pattern of square openings whereby there is formed over the semiconductive body a semiconductive layer that includes a pattern of columns of square cross-section of different conductivity characteristics.

12. The process of claim 1 in which the patterned insulating layer includes a pattern of rings whereby the second semiconductive layer formed over the semiconductive body includes ring-shaped regions of different conductivity types.

13. A process for producing an epitaxial layer with laterally varying doping comprising the steps of:

applying a patterned insulator layer to a semiconductor body;

growing a first epitaxial layer on the semiconductor body and the patterned insulator layer so that monocrystalline regions are formed over the semiconductor body and polycrystalline regions are formed over the patterned insulator layer, the angle of inclination ($\alpha$) of the interface between the monocrystalline regions and the polycrystalline regions depending on the grain size of the polycrystalline regions;

removing the polycrystalline regions and the insulator layer; and growing a second epitaxial layer which, together with the monocrystalline regions of the first epitaxial layer, forms the epitaxial layer.

* * * * *